(12) United States Patent
Sandström et al.

(10) Patent No.: US 8,537,416 B2
(45) Date of Patent: Sep. 17, 2013

(54) ROTOR OPTICS IMAGING METHOD AND SYSTEM WITH VARIABLE DOSE DURING SWEEP

(75) Inventors: Torbjörn Sandström, Pixbo (SE); Per Askebjer, Åkersberga (SE)

(73) Assignee: Micronic Laser Systems AB, Taby (SE)

( * ) Notice: Subject to any disclaimer, the term of this patent is extended or adjusted under 35 U.S.C. 154(b) by 707 days.

(21) Appl. No.: 12/718,883

(22) Filed: Mar. 5, 2010

(65) Prior Publication Data

US 2010/0225943 A1 Sep. 9, 2010

Related U.S. Application Data

(60) Provisional application No. 61/158,310, filed on Mar. 6, 2009.

(51) Int. Cl.
*G06F 15/00* (2006.01)

(52) U.S. Cl.
USPC ............. 358/1.8; 358/474; 358/1.9; 348/744; 347/248; 382/189; 235/454

(58) Field of Classification Search
USPC .................. 358/474, 1.9, 497, 496, 493, 482, 358/483; 348/744, E09.023; 347/248; 382/100, 289; 235/472.01, 454
See application file for complete search history.

(56) References Cited

U.S. PATENT DOCUMENTS

| | | | |
|---|---|---|---|
| 2,894,066 A | 7/1959 | Buckingham et al. | |
| 2,978,535 A | 4/1961 | Brown | |
| 3,335,413 A | 8/1967 | Glenn, Jr. | |
| 4,065,212 A * | 12/1977 | Belleson et al. ............... 356/398 |
| 4,123,695 A | 10/1978 | Hale et al. | |
| 4,250,873 A | 2/1981 | Bonnet | |
| 4,373,816 A * | 2/1983 | Laib ............................... 356/623 |
| 4,761,561 A | 8/1988 | Fujiwara et al. | |
| 4,853,710 A | 8/1989 | Shimada et al. | |
| 5,043,827 A | 8/1991 | Beikirch | |
| 5,189,806 A * | 3/1993 | McMurtry et al. ............... 33/503 |
| 5,289,231 A | 2/1994 | Magome et al. | |

(Continued)

FOREIGN PATENT DOCUMENTS

GB 2 185 167 A 7/1987
WO 00/57629 A1 9/2000

OTHER PUBLICATIONS

International Search Report and Written Opinion, Application No. PCT/EP2010/052861, mailed Aug. 26, 2010.

(Continued)

*Primary Examiner* — Negussie Worku

(74) *Attorney, Agent, or Firm* — Haynes Beffel & Wolfeld LLP; Ernest J. Beffel, Jr.

(57) ABSTRACT

The technology disclosed relates to translating between a Cartesian grid and a curved scanning path that produces varying exposure doses as the scanning head traces the curved scanning path. It can be applied to writing to or reading from a workpiece. In particular, we teach use of varying exposure dose that compensates for the time it takes for the curved scan path to transit a straight axis. This simplifies either modulation of a modulator, from which data is projected onto the workpiece, or analysis of data collected by a detector, onto which partial images of the workpiece are projected.

20 Claims, 3 Drawing Sheets

(56) References Cited

U.S. PATENT DOCUMENTS

| | | |
|---|---|---|
| 5,416,611 A | 5/1995 | Tandon |
| 5,652,805 A | 7/1997 | Ooenoki et al. |
| 5,661,671 A | 8/1997 | Ooenoki et al. |
| 5,815,303 A | 9/1998 | Berlin |
| 6,421,076 B1 | 7/2002 | Asaya |
| 6,549,271 B2 | 4/2003 | Yasuda et al. |
| 6,572,549 B1 | 6/2003 | Jong et al. |
| 6,700,131 B2 | 3/2004 | Nishihara et al. |
| 7,066,273 B2 * | 6/2006 | Tan ................................. 169/37 |
| 7,162,060 B1 | 1/2007 | Barton et al. |
| 7,211,980 B1 * | 5/2007 | Bruemmer et al. ........... 318/587 |
| 7,395,968 B2 * | 7/2008 | Dickson et al. .......... 235/462.01 |
| 7,515,772 B2 * | 4/2009 | Li et al. ......................... 382/289 |
| 7,633,656 B2 | 12/2009 | Miyahara |
| 8,323,724 B2 | 12/2012 | Shinohara |
| 2006/0039628 A1 * | 2/2006 | Li et al. ......................... 382/289 |
| 2006/0039629 A1 * | 2/2006 | Li et al. ......................... 382/289 |
| 2007/0188591 A1 | 8/2007 | Sandstrom |
| 2010/0142757 A1 * | 6/2010 | Sandstrom et al. ........... 382/100 |

OTHER PUBLICATIONS

International Search Report and Written Opinion, Application No. PCT/EP2010/052864, mailed Aug. 26, 2010.

Jan. 30, 2013 Amendment filed in response to Aug. 7, 2012 Office action in U.S. Appl. No. 12/718,895, pp. 1-10.

* cited by examiner

ROTOR OPTICS IMAGING METHOD AND SYSTEM WITH VARIABLE DOSE DURING SWEEP

RELATED APPLICATION

This application claims the benefit of U.S. Provisional Application No. 61/158,310, filed 6 Mar. 2009, which is hereby incorporated by reference.

This application is related to U.S. patent application No. 12/718,895 entitled "Rotor Imaging System and Method with Variable-Rate Pixel Clock" which has been allowed; and U.S. patent application No. 12/718,900 entitled "Variable Overlap Method and Device for Stitching Together Lithographic Stripes" which issued as U.S. Pat. No. 8,312,393 on 13 Nov. 2012; and U.S. patent application No. 12/718,903 entitled "Lithographic Printing System with Placement Corrections", all filed contemporaneously. The related applications are incorporated by reference.

This application is also related to U.S. patent application Ser. No. 12/706,624, entitled "Improved SLM Device and Method", filed 16 Feb. 2010 which has been allowed. The related application is incorporated by reference.

BACKGROUND OF THE INVENTION

The technology disclosed relates to translating between a Cartesian grid and a curved scanning path that produces varying exposure doses as the scanning head traces the curved scanning path. It can be applied to writing to or reading from a workpiece. In particular, we teach use of varying exposure dose that compensates for the time it takes for the curved scan path to transit a straight axis. This simplifies either modulation of a modulator, from which data is projected onto the workpiece, or analysis of data collected by a detector, onto which partial images of the workpiece are projected.

This design team recently has described in patent applications of rotor arm scanning system with very high throughput. The rotor arm scanner can, for instance, be used to write directly to large area masks.

The use of the rotor arm for scanning, instead of a shuttlecock with a reciprocating motion or a fixed head and a moving bed, is a radical departure from standard lithographic and imaging equipment. Use of the rotor presents very challenging data path issues, as the data is presented in a Cartesian grid that requires translation or mapping for use in a polar scanning system, in which the actual scanning path also involves linear motion of the workpiece as the scanning arm rotates.

Accordingly, many new components of a data path need to be developed. Many new problems not presented by prior lithographic technologies need to be identified and solved. Resolution of the many constituent engineering challenges has the potential of contributing to an overall system that has many times the pixel and area coverage throughput of prior, reciprocating systems.

SUMMARY OF THE INVENTION

The technology disclosed relates to translating between a Cartesian grid and a curved scanning path that produces varying exposure doses as the scanning head traces the curved scanning path. It can be applied to writing to or reading from a workpiece. In particular, we teach use of varying exposure dose that compensates for the time it takes for the curved scan path to transit a straight axis. This simplifies either modulation of a modulator, from which data is projected onto the workpiece, or analysis of data collected by a detector, onto which partial images of the workpiece are projected. Particular aspects of the present invention are described in the claims, specification and drawings.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

We describe methods and devices useful in a rotor-based system where printing is performed by applying a position-related function to radiation projected onto an image plane, such that the power of the projected radiation is inversely related to the position-dependent dwell time along the arc of the rotating printing head. The power function can be applied to power produced by an illumination source, to a multi-level SLM modulator, to the optical path after the SLM or in the datapath.

Variable Dose

Figure 1:
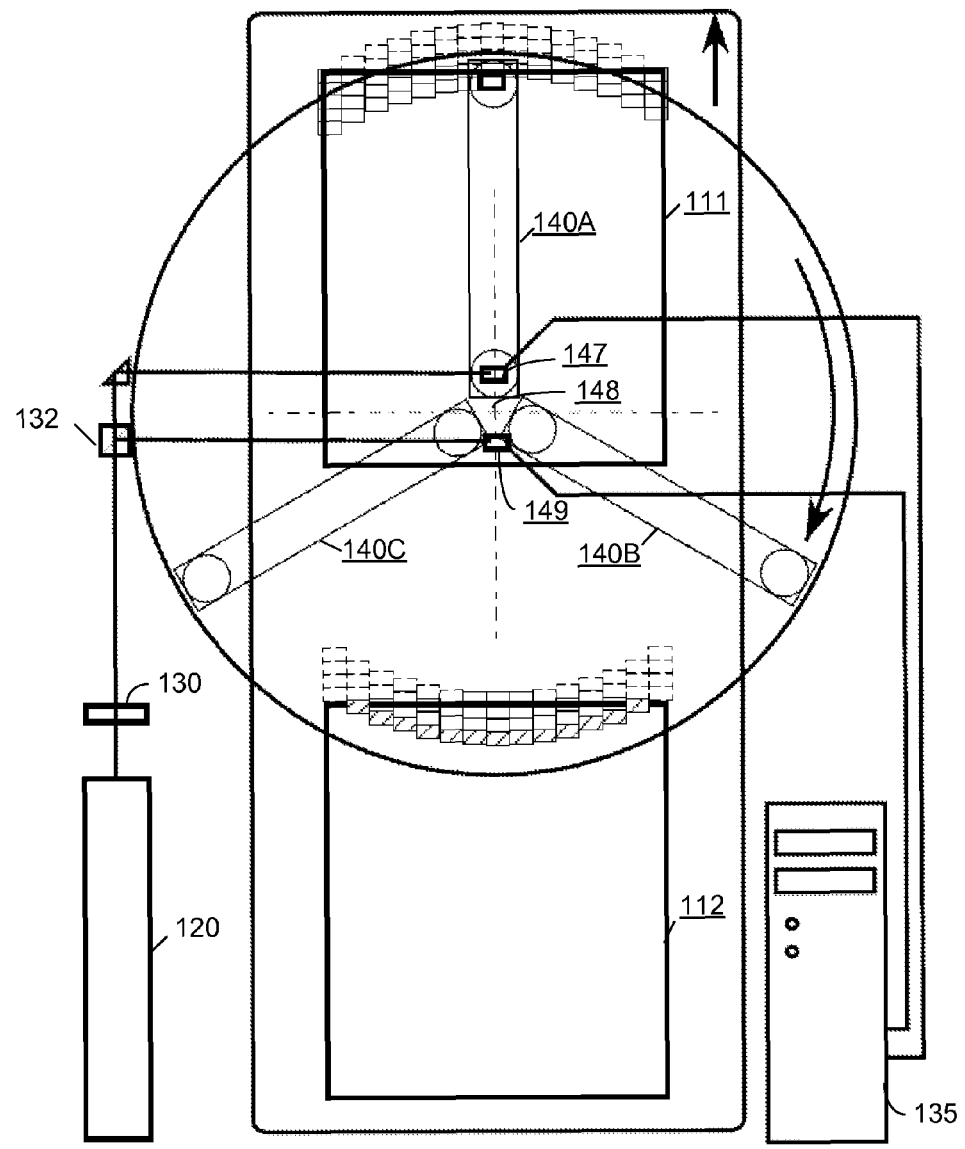
FIG. 1 depicts a scanning system with three arms and a pair of workpieces 111, 112 being written on opposite sides of the hub 148.
Figure 3:
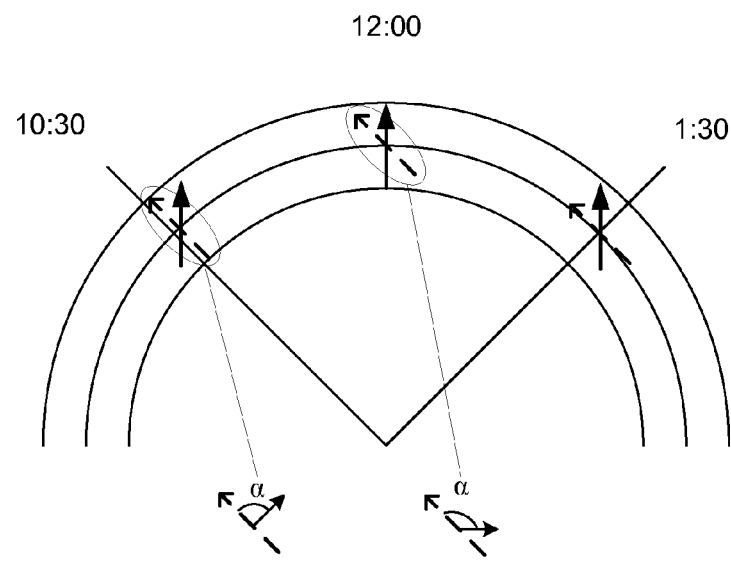
FIG. 3 depicts alternative orientations of a projected image with arrows that have a dashed and a solid shaft.

A rotary arm scanner has varying dwell times, along vertical columns, as it sweeps relative to a horizontal x axis, as illustrated in FIG. 3. Think of a stage that is moving along a y axis and a rotary print head that sweeps from one side to the other along a circular path, as illustrated in FIG. 1. A varying pixel clock can be used to divide the arc into elements equally spaced along the x axis. A "tick" or period of a varying pixel clock lasts longer when the clock hand is in a 10 or 2 o'clock position than when it is in a 12 o'clock position, because the rotor is sweeping an area that is more vertical than horizontal. Alternatively, at a fixed clock rate, more ticks of the clock pass as the rotor arm sweeps the first or fourth quarters of the x axis than the middle quarters. Either way, a larger dose of radiation is relayed per x axis distance by the writing head near the edge (10:30 or 1:30) than at the center (12 noon) as the rotor sweeps a circular arc. Mapping of rasterized data to pixels for printing can be simplified by compensating for the relative dwell time of the rotating arm as it sweeps, as the arm moves from a 10 o'clock position to a 12 and 2 o'clock position.

In some practical implementations, the projection onto the image plane of the workpiece is essentially a line segment. It is much longer than it is wide. It exposes an image as the optics translate the line segment along an arc. The width of the image may be 3, 5 or 10 nm, as further described in the following section.

In FIG. 3, we depict alternative orientations of a projected image with arrows that have a dashed and a solid shaft. The arrow with the dashed shaft is 45° to vertical. The arrow with a solid shaft is vertical. Considering left-most the dashed arrow, the arrow has its maximum extent, as measured along the radius of the rotating arm, when it is at the 10:30 position. At the 12 o'clock position, the arrow sweeps an extent that is √2/2 times as large as at the 10:30 position. At 2 o'clock position, the arrow sweeps a point. This is the familiar stroke of a calligrapher's pen, held at a 45° angle.

The second arrow, with a solid shaft and vertical orientation, also sweeps a calligraphic stroke, except that it has its maximum extent at the 12 o'clock position, instead of the 10:30 position.

From the examples of these two arrows, we see that the extent swept by the line segment of the constant orientation is a trigonometric function of the line segment orientation to the direction of sweep. It can be expressed as the sine of the angle between the line segment orientation and the direction of sweep (labeled $\alpha$ in the figure) or as the cosine of the angle between the normal to the line segment orientation and the direction of sweep. In the simplest case, with a vertical projected line segment and stationary workpiece, the angle $\alpha$ is a function of the arm position. The angle $\alpha$ is slightly more complicated to calculate when the workpiece is moving a constant speed, such as vertically in the figure. In the most general case, the angle $\alpha$ is a function of the line segment orientation, the rotor's position and speed, and the workpiece's velocity.

Figure 4:
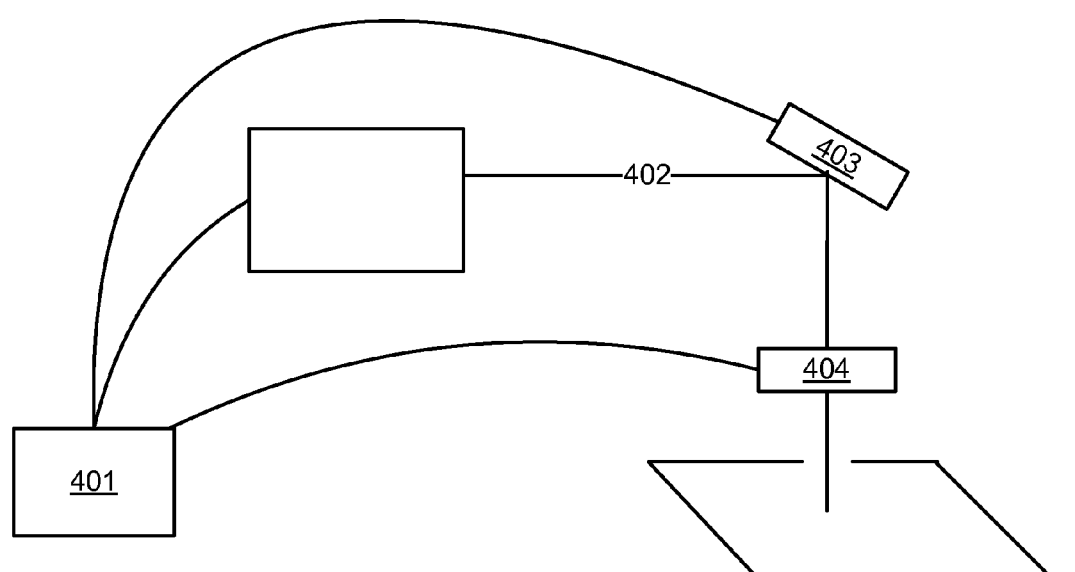
FIG. 4 illustrates alternatives for applying the compensation function to radiation projected onto an image plane.

FIG. 4 illustrates alternatives for applying the compensation function to radiation projected onto an image plane: The power of the projected radiation is inversely related to the position-dependent dwell time. The power function 401 can be implemented in a LUT or transformation. In this sense, transformation includes trigometric, polynomial and other functions that can be computed. The power function 401 can be applied to power output of an illumination source 402, to modulation of a multi-level SLM modulator 403, or in the optical path after the SLM 404. There are many ways of reducing the power from the illuminator 402, including number of pulses, pulse duration, power per pulse (or in continuous beam.) Attenuators such as Kerr cell variable polarization, electro-optics or acusto optic cells, or using other mechanisms could be positioned before 402 on or after 404 the SLM.

Another way to apply the compensation function is to modulate of the SLM. This approach uses the analog control range of the SLM. The DAC that drives the mirror angle has many more potential driving voltages than are directly used as grey scaled exposure values. Hence, we sometimes refer to the fine granular control of the SLMs "analog." Using the compensation function to adjust modulation of the SLM will reduce the contrast or dynamic range of the SLM, but the reduction is modest, perhaps from 200:1 to 150:1 when the rotor is at the beginning or end of its sweep and no reduction when the rotor is at the 12 o'clock position.

Control of the SLM could be accommodated using a DAC resolution of 7-8 bits. More is better. The error budget will eventually give a firm figure. SLMs with 14 bit or greater resolution are available.

A position-varying dose is useful for rotor scanning. As described in prior applications, a rotor system may include multiple arms with optics that relay modulated illumination from a modulator, along the arms, to an image plane of a workpiece. See FIG. 1, which is further explained below. The workpiece moves on a bed underneath the rotating arm. The relay of modulated radiation from an SLM onto the image plane maintains an image orientation that remains steady as the arm sweeps an arc. FIG. 3 illustrates a steady image orientation. At the left hand edge of the arc, say at the 10 o'clock position, an arrow pointing up would be pointing the same direction as when the arm is at the 12 o'clock or 1:30 position.

In prior art, e.g., Canon's REBL, the image is always at a constant orientation to the direction of travel. With the rotor geometry, this angle $\alpha$ is varying. The problem of a varying exposure dose over the rotation is solved by applying an automatic correction based on a trigonometric function of the angle $\alpha$, approximately proportional to the sine of said angle.

Rotor Optics

Environments in which the technology disclosed is particularly useful include a rotating arm printing or viewing device with relay optics with a hub at one end of the arm and optics at the other end, which couple image information with the surface of a workpiece. The optical coupling at the hub may be either on or off the axis of rotation. The following section provides background on the inventive rotor system that is useful for understanding the role of a variable dose or dose compensation function.

A rotor arm system can write to (or read from) a workpiece. It uses a stationary optical image device to modulate (or collect) relayed image information. It relays the image information along optics of at least one rotating arm between the stationary optical image device and a surface of the workpiece. By repeatedly sweeping a curved stripe across the surface of the workpiece, a contiguous image may be written from overlapping partial images by stitching together the partial images on the workpiece.

Pattern information, e.g., a partial image, is relayed between the optical image device and the surface of the workpiece with a substantially constant azimuthal orientation. By "substantially constant," we include a small rotation that is within tolerances or that is corrected in raterizing, producing no more than a 0.5 degree rotational variation in the angular relationship when the relayed versions are separated by more than 5 degrees sweep of the rotating optical arm.

The rotor can have several arms, e.g. 2, 3, 4, 6, or 8 arms, thereby multiplying the scanned surface area per time unit. Heavy, complex, fragile machine parts, or parts that are expensive or need many connections and services can be placed stationary near the center or hub of the rotor and be shared by the multiple arms. An image is relayed between a stationary image device placed at or near the hub of the rotor and the workpiece, through the radial arm.

The rotor system is described by reference to relay optics because it can be used to write to or read from a workpiece. For instance, it is useful to write directly to a large area mask or a PCB. Or, it can be used to inspect a large area mask. It is used with a workpiece positioning mechanism, such as a stage, details of which are outside the scope of this disclosure.

FIG. 1 depicts a rotor scanning system with three arms and a pair of workpieces 111, 112 being written on opposite sides of the hub 148. This system may have a duty cycle of 100%. Each rotor writes through an arc of 60 degrees. Only one arm 140 writes at a time, alternatively on the two workpieces 111 and 112. The laser energy is switched by polarization control 132 between the two SLMs 147 and 149, and the data stream is also switched between the SLMs. Since the laser 120 and the data path 135 are among the most expensive modules in a writing machines, this embodiment has been designed to use laser and data channel 100% of the time while the SLMs and the optics in the arms has lower duty cycles, 50% and 33% respectively. This may be, for instance, an example of a writing system with three rotating arms 140A-C. There are a variety of alternative designs for these arms and the relay optics. The figure conceptually depicts a laser 120 and a controller 135 sending data to two SLMs 130 which are relayed 132, 147, 149 to the rotating arms. It shows how each arm moves in front of each SLM and writes a series of concentric stamps on the workpieces 111, 112. While two workpieces are shown in this figure, more workpieces could be positioned under a rotor, depending on its size. While the example is described as a writing system, the direction of relay could just as easily be from the workpiece back to a pair of detectors positioned where the laser 120 is and elsewhere. In alternative configurations, one workpiece might be used; four arms might be used.

Some particularly useful applications of this technology involve writing patterns on electronic substrates, such as: wafers' front and back sides; PCBs; build-up, interposer and flexible interconnection substrates; and masks, stencils, templates and other masters. Likewise, the rotor writer can be used for patterning panels in displays, electronic paper, plastic logic and photovoltaic cells. The patterning can be done by exposure of photoresist, but also through other actions of light such as thermal or photochemical processes: melting, evaporation, ablation, thermal fusing, laser-induced pattern transfer, annealing, pyrolytic and photo induced etching and deposition.

A rotor system replaces the customary motion of a Cartesian flatbed xy stage with a polar scanning motion. Potential benefits include high throughput, low cost and mechanical simplicity. The scanning action is done by a rotating motion, which is mechanically easier to build to high accuracy than straight-line motion. The position accuracy of a point on the periphery of the rotor is determined by the quality of a bearing and the accuracy of an angle encoder. Both of these components can be sourced with high quality. A rotational reduces vibrations and transient forces during scanning and between scanning strokes. A well-balanced rotor emits essentially no vibrations or reactive forces to the supporting structure, while reciprocating straight movements need to reverse their momentum twice per stroke and create strong disturbances when doing so. A rotor may have a higher scanning velocity with less mechanical overhead. A rotor with several arms uses nearly the whole circle for writing. For instance, a rotor with four arms may scan through an 80 degree arc. Out of the 360 degrees in a circle, the rotor scans during 4×80=320 degrees. A reciprocating movement needs more mechanical overhead. The overhead for reciprocating movement gets larger with increased scanning velocity.

Rotor systems may have a very high data rate and throughput and may be used for other types of patterning where these characteristics are useful: photo-setting, printing, engraving, security marking, etc. The rotor has a smooth movement and small mechanical overhead even at high rotation speeds, e.g. 60, 120, 300, 600 r.p.m. or higher. The scanning speed, which is the peripheral speed of the rotor, may be higher than comparable reciprocating systems, e.g. 2, 4, 8, 20 m/s or higher.

In practical terms, one implementation would have a rotor one meter in diameter, spinning 3.3 turns per second with a centripetal acceleration of 20 g. The acceleration force gives a constant force on rotating components, such that a lens weighing 50 grams will feel a constant force outwards of 10 N. With four arms and rotational speed, the system writes 13 strokes per second with a peripheral velocity of 10 m/s, a mechanical speed that is impractical with a reciprocating stage. Furthermore, with proper balancing and design of the bearings the motion will be smooth, have high mechanical precision and need little power to be sustained. If the image generator is a micromechanical 1D SLM with constant 2 MHz frame rate used for creating a 1D partial image on the workpiece, the reloading of the SLM would occur every 5 microns along the scanning direction and the pixel size could be 5×5 microns, allowing line width of less than 15 microns to be written. With a micromechanical 1D SLM, effectively having 8000×1 pixels, each stroke would fill a stripe 40 mm wide with pattern, and cover—with some reduction for the non-straight scan –0.3 square meters per second or 20 square meters per minute. This is a very high coverage rate, compared to other writing technologies.

Figure 2:
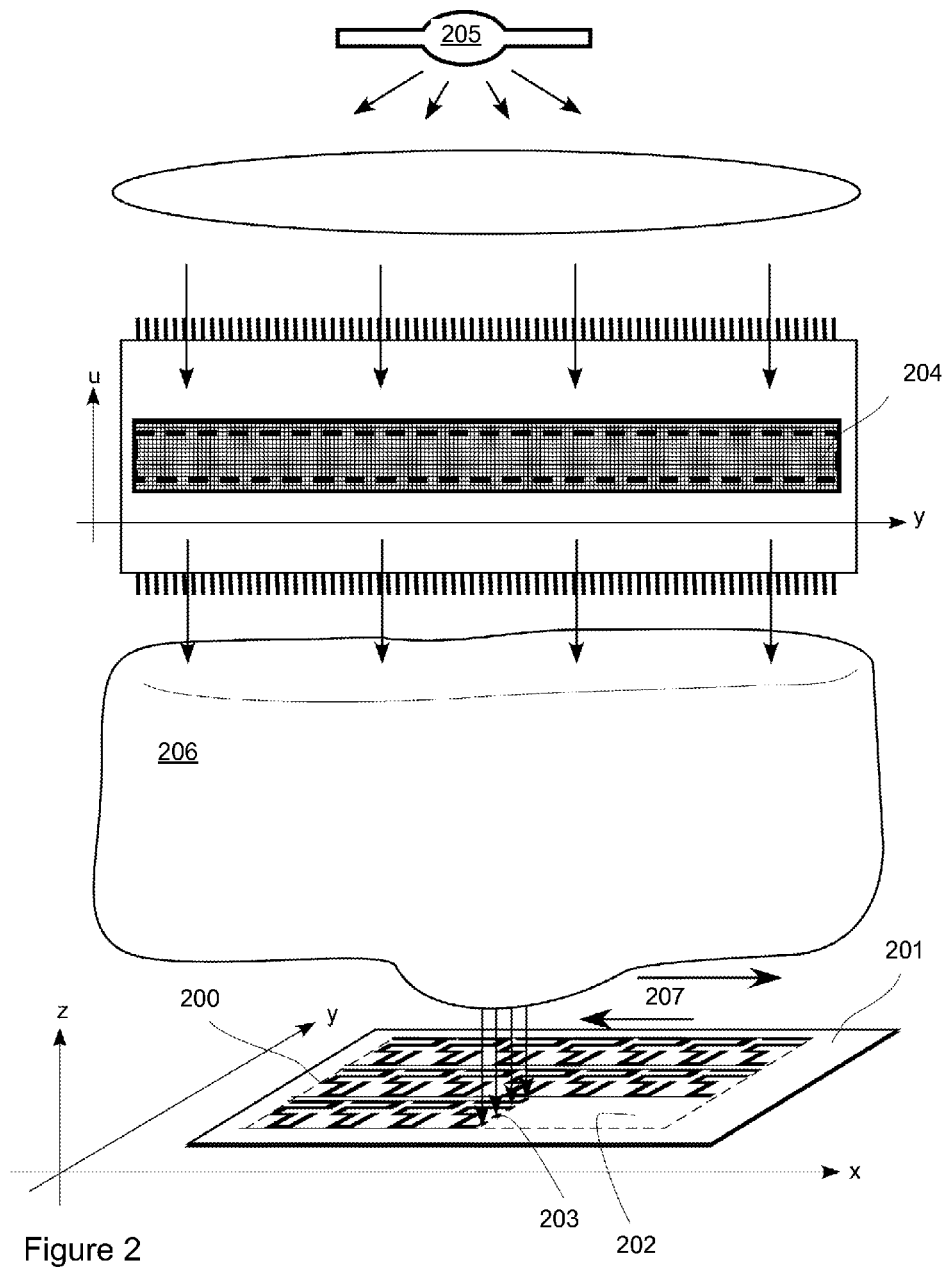
FIG. 2 further describes use of a so-called one-dimensional SLM with anamorphic optics.

FIG. 2 further describes use of a so-called one-dimensional SLM with anamorphic optics. A light source 205 (arc lamp, gas discharge, laser, array of lasers, laser plasma, LED, array of LEDs etc.) illuminates a one-dimensional SLM 204. The reflected (or transmitted in the general case) radiation is projected as a line segment 203 on a workpiece 201. The data driving the SLM changes as the workpiece is scanned 207 to build up an exposed image. A strongly anamorphic optical system 206 concentrates energy from multiple mirrors in a column (or row) to point in the image and the entire two-dimensional illuminated array forms a narrow line segment 203 that is swept across the workpiece. In one dimension, the anamorphic optics demagnify the illuminated area, for instance, by 2× to 5×, so the a 60 millimeter wide SLM would image onto a line segment 30 to 12 mm long. Along the short dimension, the anamorphic optics strongly demagnify the column of mirrors to focus onto a narrow area such as 3 microns wide, i.e. essentially a single resolved line. Alternatively, the area could be 1 or 5 microns wide or less than 10 microns wide. Focus onto a 3 micron wide area could involve an 80× demagnification, from approximately 240 microns to 3 microns. The anamorphic optical path demagnifies the row of mirrors to an extent that individual mirrors are combined and not resolved at the image plane. As described in related applications, the SLM could be positioned in a plane that is in sharp focus along one dimension of the SLM and de-focused along the other dimension. This would decrease the criticality of the lense system.

A rotor enables many image processing instruments to be used on large flat substrates and scanning at high speed, e.g. on solar panels, display substrates, sheet metal, architectural glass, roll-to-roll plastic, paper, and the like. Through the rotating arms an image may be captured at the periphery and transferred to the hub where a camera or an optical analytical instrument may be situated, e.g. a reflectometer, spectrophotometer, scatterometer, multispectral camera, polarimeter, fluorescence or photo-luminescence instrument. Instruments that are complex, bulky or fragile can be mounted fixed at the hub and still access any point on the surface of, say, a two meter wide thin-film photovoltaic panel passing on a conveyor under the rotor, thereby enabling full-area inspection or analysis at dense grids on large workpieces without removing sheets for analysis or stopping the roll-to-roll flow. The rotor may have only flat optics or it may have reflecting relays in the arms, allowing achromatic use from far IR to deep UV. The illumination, e.g. UV for fluorescence studies, may be brought from the hub or it may be generated within the rotor.

As mentioned above, the disclosed technology enables many instruments to be used on large flat substrates and scanning at high speed, e.g. on solar panels, display substrates, sheet metal, architectural glass, roll-to-roll plastic, paper, and the like. Through the rotating arms an image may be captured at the periphery and transferred to the hub where a camera or detector (e.g., a vidicon, CCD, CID, CMOS device, and/or a TDI, intensified, gated, avalanche, single photon, photon-counting, interferometric, colorimetric, heterdyne, photoconductive or bolometric detector or array) is located, or an optical analytical instrument may be situated, (e.g., a reflectometer, spectrophotometer, colorimeter, scatterometer, multispectral camera, polarimeter, or a fluorescence, photo-luminescence or photoacoustic instrument).

Other possible uses are for optical measurements of heat (infrared emission), color, flatness, smoothness, film thickness, chemical composition, cleanliness, or for verification of pattern integrity or fidelity. The method is particularly beneficial where an image of the surface or an exact location of a found defect or feature is needed. Instruments that are complex, bulky or fragile can be mounted fixed at the hub and still access any point on the surface of, say, a two meter wide thin-film photovoltaic panel passing on a conveyor under the rotor, thereby enabling full-area inspection or analysis at dense grids on large workpieces without removing sheets for analysis or stopping the roll-to-roll flow. The rotor may have only flat optics or it may have reflecting relays in the arms, allowing achromatic use from far IR to deep UV. The illumination (e.g. visible incident light for reflected-light microscopy) may be brought from the hub or it may be generated within the rotor. Several instruments and or writing modes may be combined in one rotor, either by being combined in one optical arm or by employing different ones. At least one instrument or optical image device may emit an exciting beam through an arm and receives an image back from the workpiece, e.g. UV for fluorescence studies. The rotation may be continuous with a constant or varying angular speed or alternatively be driven by in a stop and go fashion, in particular for random-access analysis of workpieces. Focusing of the imaging optics may be fixed, variable from time to time or dynamic during scanning and based on feedback from focus sensors based on interferometry, back-reflection, proximity to a fiber end, optical triangulation, optical defocus or parallax; fluid flow, pressure or viscous resistance; ultrasound time-of-flight or phase; capacitance, inductance or other suitable phenomena indicating a distance or position.

Some Particular Embodiments

The technology disclosed may be practiced as a method or device adapted to practice the method. The technology may be embodied in an article of manufacture such as media impressed with logic to carry out computer-assisted method or program instructions that can be combined with hardware to produce a computer-assisted device.

One embodiment is a method of adjusting exposing doses that vary and accumulate along first axis of a workpiece as a writer sweeps a curved path that is not parallel to the first axis. The direction of sweep of a scanning head is determined when writing a particular pixel of a rasterized image onto a workpiece or reading a particular pixel from the workpiece 201. This determination may be analytical/predictive or sensed during operation of the writer. The method can proceed ahead of writing or during writing. The correction factor can be looked up in a computer readable storage medium or calculated based at least in part on an angle of the direction of sweep relative to a first axis of the workpiece. The correction factor for the particular pixel is applied to adjust a cumulative exposing or reading intensity of the particular pixel at the workpiece.

In alternate embodiments, the correction factor is approximately sinusoidal as the scanning head sweeps an approximately circular arc across the workpiece. In another embodiment, the angle relative to the first axis can determine both the sweep of the scanning head in a first direction and movement of the workpiece in a second direction.

One aspect of the technology disclosed, applicable to any of the embodiments above, is that the scanning head maintains substantially the same projected image orientation relative to the axis through the sweep of the scanning head across the workpiece, further including the projected image orientation of the scanning head relative to the axis when determining the angle.

Another aspect of the technology disclosed includes sensing an angular position of the writing head as part of determining the direction of sweep. The correction factor can be applied to raw image dose data to generate corrected image dose data and driving a modulator with the corrected image dose data. Alternately, the correction factor can also be applied to an illumination source 402, whereby the raw image dose is corrected by the strength of the illumination to the corrected image dose.

Any of the methods described above or aspects of the methods may be embodied in a cumulative intensity adjusting device useful as part of a pipeline that processes signals through a scanning head mounted on a rotor from rasterized image data for writing to or reading from a workpiece. In one embodiment, a sweep direction calculator is used to determine the direction of sweep of the scanning head when a particular pixel of a rasterized image is written onto a workpiece. The cumulative intensity adjusting device may include a lookup memory or program function that determines a correction factor that is based at least in part on an angle of the direction of sweep relative to the axis. A correction calculator is coupled to the sweep direction calculator and the lookup memory or program function, wherein the correction calculator uses the least the direction of sweep to determine the correction factor, the correction calculator applies the correction factor to a raw pixel value, and outputs a corrected pixel value.

In another embodiment, the correction factor is approximately sinusoidal as the scanning head sweeps an approximately circular arc across the workpiece. This embodiment may, of course, be combined with other aspects of the methods.

One aspect of the technology disclosed includes the correction calculator further uses at least the angle relative to the first axis both the sweep of the scanning head in a first direction and movement of the workpiece in a second direction to determine the correction factor.

Another aspect of the technology disclosed maintains the scanning head with substantially the same projected image orientation relative to the axis through the sweep of the scanning head across the workpiece, wherein the correction calculator further uses at least the projected image orientation of the scanning head relative to the axis when determining the angle.

The methods and devices described immediately above and aspects or embodiments of the methods and devices may be embodied in a sensing device coupled to the sweep direction calculator that senses an angular position of the writing head. The said device may also include a dose calculator that applies the correction factor to raw image dose data to generate corrected image dose data and a modulator coupled to the dose calculator and response to the corrected image dose data. Alternately, the correction factor can also be applied to an illumination adjuster that applies the correction factor to an illumination system whereby the raw image dose is corrected by the strength of the illumination to the corrected image dose.

The present invention also may be characterized from the perspective of the reading head, as opposed to the writing head. From this perspective, the present invention includes a sensing device coupled to the sweep direction calculator that senses an angular position of the writing head. The said device may also include a dose calculator that applies the correction factor to raw image dose data to generate corrected image dose data and a modulator coupled to the dose calculator and response to the corrected image dose data. Alternately, the correction factor can also be applied to an illumination adjuster that applies the correction factor to an illumination system whereby the raw image dose is corrected by the strength of the illumination to the corrected image dose. Aspects of the preceding method may be combined with this method.

While the disclosed technology is disclosed by reference to the preferred embodiments and examples detailed above, it is understood that these examples are intended in an illustrative rather than in a limiting sense. Computer-assisted processing is implicated in the described embodiments, implementations and features. Accordingly, the disclosed technology may be embodied in methods for reading or writing a workpiece using at least one optical arm that sweeps an arc over the workpiece, systems including logic and resources to carry out reading or writing a workpiece using at least one optical arm that sweeps an arc over the workpiece, systems that take advantage of computer-assisted control for reading or writing a workpiece using at least one optical arm that sweeps an arc over the workpiece, media impressed with logic to carry out, data streams impressed with logic to carry out reading or writing a workpiece using at least one optical arm that sweeps an arc over the workpiece, or computer-accessible services that carry out computer-assisted reading or writing a workpiece using at least one optical arm that sweeps an arc over the workpiece. It is contemplated that modifications and combinations will readily occur to those skilled in the art, which modifications and combinations will be within the spirit of the disclosed technology and the scope of the following claims.

We claim as follows:

1. A method of adjusting exposing doses that vary and accumulate along first axis of a workpiece as a writer sweeps a curved path that is not parallel to the first axis, the method including:
   determining a direction of sweep of a scanning head when writing a particular pixel of a rasterized image onto a workpiece or reading a particular pixel from the workpiece;
   looking up in a computer readable storage medium or calculating a correction factor based at least in part on an angle of the direction of sweep relative to a first axis of the workpiece; and
   applying the correction factor for the particular pixel to adjust a cumulative intensity at the workpiece of the particular pixel.

2. The method of claim 1, wherein the correction factor is approximately sinusoidal as the scanning head sweeps an approximately circular arc across the workpiece.

3. The method of claim 2, further including in determining the angle relative to the first axis both the sweep of the scanning head in a first direction and movement of the workpiece in a second direction.

4. The method of claim 2, wherein the scanning head maintains substantially the same projected image orientation relative to the axis through the sweep of the scanning head across the workpiece, further including the projected image orientation relative to the axis when determining the angle.

5. The method of claim 2, further including sensing an angular position of the reading head as part of determining the direction of sweep.

6. The method of claim 2, further including applying the correction factor to an illumination source, whereby the raw image dose is corrected by the strength of the illumination to the corrected image dose.

7. The method of claim 1, further including applying the correction factor to an illumination source, whereby the raw image dose is corrected by the strength of the illumination to the corrected image dose.

8. The method of claim 1, further including sensing an angular position of the writing head as part of determining the direction of sweep.

9. The method of claim 1, further including applying the correction factor to raw image dose data to generate corrected image dose data and driving a modulator with the corrected image dose data.

10. The method of claim 1, further including applying the correction factor to raw image dose data to generate corrected image dose data and driving a modulator with the corrected image dose data.

11. A cumulative intensity adjusting device including:
    a sweep direction calculator that determines the direction of sweep of the scanning head when a particular pixel of a rasterized image is written onto a workpiece;
    a lookup memory or program function that determines a correction factor that is based at least in part on an angle of the direction of sweep relative to the axis; and
    a correction calculator that is coupled to the sweep direction calculator and the lookup memory or program function, wherein the correction calculator uses the least the direction of sweep to determine the correction factor, the correction calculator applies the correction factor to a raw pixel value, and outputs a corrected pixel value to memory.

12. The device of claim 11, wherein the correction factor is approximately sinusoidal as the scanning head sweeps an approximately circular arc across the workpiece.

13. The device of claim 12, wherein the correction calculator further uses at least the angle the sweep of the scanning head in a first direction and movement of the workpiece in a second direction to determine the correction factor.

14. The device of claim 11, wherein the scanning head maintains substantially the same projected image orientation relative to the axis through the sweep of the scanning head across the workpiece, wherein the correction calculator further uses at least the projected image orientation of the scanning head relative to the axis when determining the angle.

15. The device of claim 11, further including a sensing device coupled to the sweep direction calculator that senses an angular position of the writing head.

16. The device of claim 11, further including a dose calculator that applies the correction factor to raw image dose data to generate corrected image dose data; and a modulator coupled to the dose calculator and response to the corrected image dose data.

17. The device of claim 11, further including an illumination adjuster that applies the correction factor to an illumination system, whereby the raw image dose is corrected by the strength of the illumination to the corrected image dose.

18. The device of claim 11, coupled with a sensing device that senses an angular position of the reading head as part of determining the direction of sweep.

19. The device of claim 18, further including a dose calculator that applies the correction factor to raw image dose data to generate corrected image dose data; and drives a modulator coupled to the dose calculator and response to the corrected image dose data.

20. The device of claim 18, further including an illumination adjuster that applies the correction factor to an illumination system, whereby the raw image dose is corrected by the strength of the illumination to the corrected image dose.

* * * * *